(12) United States Patent
Van de Sande et al.

(10) Patent No.: US 7,724,162 B2
(45) Date of Patent: May 25, 2010

(54) CIRCUIT FOR SAMPLE RATE CONVERSION

(75) Inventors: Frank Van de Sande, Leuven (BE); Alvin Andries, Leuven (BE)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/179,914

(22) Filed: Jul. 25, 2008

(65) Prior Publication Data

US 2009/0058692 A1 Mar. 5, 2009

(30) Foreign Application Priority Data

Aug. 31, 2007 (GB) ................. 0716942.8

(51) Int. Cl.
*H03M 7/00* (2006.01)
(52) U.S. Cl. .................................. 341/61; 341/143
(58) Field of Classification Search ............. 341/61, 341/143, 144, 155; 455/334; 375/332
See application file for complete search history.

(56) References Cited

U.S. PATENT DOCUMENTS

| | | | | |
|---|---|---|---|---|
| 5,521,946 A | * | 5/1996 | Main ...................... | 375/350 |
| 5,594,675 A | | 1/1997 | Peng | |
| 5,717,715 A | * | 2/1998 | Claydon et al. ............ | 375/220 |
| 5,892,468 A | * | 4/1999 | Wilson et al. ............. | 341/61 |
| 6,362,760 B2 | * | 3/2002 | Kober et al. .............. | 341/141 |
| 6,531,969 B2 | * | 3/2003 | Chu ........................ | 341/61 |
| 7,002,940 B2 | * | 2/2006 | Welborn ................... | 370/335 |
| 2003/0067973 A1 | | 4/2003 | Lee et al. | |
| 2005/0018796 A1 | | 1/2005 | Sande et al. | |
| 2006/0159202 A1 | * | 7/2006 | Breiling .................... | 375/332 |
| 2006/0178759 A1 | * | 8/2006 | Koehler ..................... | 700/18 |

FOREIGN PATENT DOCUMENTS

WO 0065713 11/2000

OTHER PUBLICATIONS

Great Britain search report dated Dec. 20, 2007.

* cited by examiner

*Primary Examiner*—Peguy JeanPierre

(57) ABSTRACT

The present invention is related to a circuit for converting the sample rate of a digital signal, comprising
an input for applying the digital signal,
a conversion filter having either a symmetrical or anti-symmetrical impulse response and implemented as a plurality of subfilters in parallel, each subfilter having a symmetrical or anti-symmetrical response derived from components of a polyphase decomposition of said impulse response,
combining means for deriving from said applied digital signal input signals of said plurality of subfilters or for combining output signals of said plurality of subfilters into a digital signal with converted sample rate,
an output for outputting said digital signal with converted sample rate.

5 Claims, 2 Drawing Sheets

CIRCUIT FOR SAMPLE RATE CONVERSION

This application claims priority from Great Britain Patent Application, No. GB 0716942.8 filed on 31 Aug. 2007, which is incorporated by reference in its entirety.

FIELD

The present invention relates to the field of digital integer factor sample rate conversion (i.e. decimation and interpolation).

BACKGROUND

Digital sample rate conversion (SRC) is a technique to replace a system that includes a variety of master clock rates with a fixed clock rate system. Applications are abundant, e.g. acquisition (signal generator) systems with an oversampled ADC (DAC), followed (preceded) by a digital decimator (interpolator) to relieve the analog anti-aliasing (reconstruction) filter specifications. Integer factor SRC also appears in analysis (i.e. decimation) and synthesis (i.e. interpolation) filter banks.

To explain the problem tackled in the present invention a linear phase digital filter is assumed of order N, implying a finite impulse response h(k) of length N+1 (Eq. 1) with symmetric (Eq. 2) or anti-symmetric (Eq. 3) impulse response.

$$y[n] = \sum_{k=0}^{N} h[k]x[n-k] \quad \text{(Eq. 1)}$$

$$h[k] = h[N-k] \text{ with } k \in 0 \ldots N \quad \text{(Eq. 2)}$$

$$h[k] = -h[N-k] \text{ with } k \in 0 \ldots N \quad \text{(Eq. 3)}$$

$T_f$ is defined as the sample period of the output signal (for an interpolator) or the input signal (for a decimator). Thus, $T_f$ is the sample period of the signal with the fastest sample rate. For a single-rate filter $T_f$ is equal to the sample period of both input and output signals.

M is defined as the number of multiplications per output sample and per sample period $T_f$. A single rate realisation of Eq. 1 results in #M as given in Eq. 4. Also naive realisations of Eq. 1 in integer factor interpolators and decimators have that same #M as shown in Eq. 4.

$$\#M = N+1 \quad \text{(Eq. 4)}$$

In a single-rate system a linear phase FIR realisation can take advantage of its impulse response symmetry (Eq. 5) or anti-symmetry (Eq. 6); whereby $\lfloor \ \rfloor$ denotes a truncation to the lower integer.

$$y[n] = \sum_{k=0}^{\lfloor \frac{N}{2} \rfloor} h[k](x[n-k] + x[n+k-N]) \text{ for } N \text{ odd} \quad \text{(Eq. 5)}$$

$$y[n] = h\left[\left\lfloor \frac{N}{2} \right\rfloor\right]x\left[\left\lfloor \frac{N}{2} \right\rfloor\right] + \sum_{k=0}^{\lfloor \frac{N}{2} \rfloor - 1} h[k](x[n-k] + x[n+k-N]) \text{ for } N \text{ even}$$

$$y[n] = \sum_{k=0}^{\lfloor \frac{N}{2} \rfloor} h[k](x[n-k] - x[n+k-N]) \text{ for } N \text{ odd} \quad \text{(Eq. 6)}$$

$$y[n] = h\left[\left\lfloor \frac{N}{2} \right\rfloor\right]x\left[\left\lfloor \frac{N}{2} \right\rfloor\right] + \sum_{k=0}^{\lfloor \frac{N}{2} \rfloor - 1} h[k](x[n-k] - x[n+k-N]) \text{ for } N \text{ even}$$

By means of Eq. 5 and Eq. 6 the number of multiplications per output sample #M is reduced from N+1 to $$\#M = \left\lfloor \frac{N}{2} \right\rfloor + 1 \quad \text{(Eq. 7)}$$

Another generally known principle is multi-phase decomposition for sample rate conversion. Equation 8 defines the polyphase components $h_\lambda(n \cdot LT_f)$ for an L-fold decomposition of impulse response $h(k \cdot T_f)$.

$$h'_\lambda(n \cdot LT_f) = h((nL+\lambda)T_f) \quad \text{(Eq. 8)}$$

with $\lambda = 0 \ldots L-1$

The filter $h(k \cdot T_f)$ has a frequency response to select the desired signal image (for an interpolator) or anti-aliasing band (for a decimator).

The corresponding Z-transforms are combined in vector $\overline{H}(z)$ (Eq. 9).

$$H_\lambda(z) = Z\{(h_\lambda(n \cdot LT_f)\}$$

$$\overline{H}(z) = [H_0(z) \ldots H_1(z) \ldots H_{L-1}(z)]^T \quad \text{(Eq. 9)}$$

The polyphase equation for an L-factor interpolator is shown in Eq. 10:

$$\overline{Y}(z) = \overline{H}(z) \cdot X(z) \quad \text{(Eq. 10)}$$

whereby X(z) denotes the Z-transform of the input signal x(n·LT) and $\overline{Y}(z)$ the decomposition of the output signal $y(k \cdot T_f)$ as defined in Eq. 11.

$$y_\lambda(n \cdot LT_f) = y((nL+\lambda)T_f)$$

$$Y_\lambda(z) = Z\{y_\lambda(n \cdot LT_f)\}$$

$$\overline{Y}(z) = [Y_0(z) \ldots Y_1(z) \ldots Y_{L-1}(z)]^T \quad \text{(Eq. 11)}$$

with $\lambda = 0 \ldots L-1$

For an L-factor decimator the polyphase equation is shown in equation 12.

$$Y(z) = \overline{H}^T(z) \cdot \overline{X}(z) \quad \text{(Eq. 12)}$$

$y(n \cdot LT_f)$ hereby represents the output signal. The decomposition of the input signal $x(k \cdot T_f)$ is as defined in equation 13.

$$x_\lambda(n \cdot LT_f) = x((nL+\lambda)T_f)$$

$$X_\lambda(z) = Z\{x_\lambda(n \cdot LT_f)\}$$

$$\overline{X}(z) = [X_0(z) \ldots X_1(z) \ldots X_{L-1}(z)]^T \quad \text{Eq. 13}$$

with $\lambda = 0 \ldots L-1$

The efficiency of the polyphase realisations (as in Eqs. 10 and 12) lies in the fact that all filter operations are performed at the lowest rate, i.e. at $1/(LT_f)$ instead of at $1/T_f$. The average number of multiplications per output sample and per $T_f$ for a polyphase interpolator (or decimator) is given in Eq. 14.

$$\# M = \frac{N+1}{L} \quad \text{(Eq. 14)}$$

However, the $h(kT_f)$ (anti-)symmetry generally does not yield intra-phase (anti-)symmetry in most $h_\lambda(nLT)$ phases. The 2-fold decomposition for an even (N=8) order impulse response $h(kT_f)$ as shown in Eq. 15 is one example of an exception. Since $h_{8-i}=h_i$, both phases $H_0(z)$ and $H_1(z)$ are symmetric.

$$H_0(z)=h_0+h_2z^{-1}+h_4z^{-2}+h_6z^{-3}+h_8z^{-4}$$

$$H_1(z)=h_1+h_3z^{-1}+h_5z^{-2}+h_7z^{-3} \quad \text{(Eq. 15)}$$

In Eq. 16 (where L=3 and N=11), $H_1(z)$ is symmetric for a symmetric $H(z)$, but the other phases $H_0(z)$ and $H_2(z)$ are not symmetric.

$$H_0(z)=h_0+h_3z^{-1}+h_6z^{-2}+h_9z^{-3}$$

$$H_1(z)=h_1+h_4z^{-1}+h_7z^{-2}+h_{10}z^{-3}$$

$$H_2(z)=h_2+h_5z^{-1}+h_8z^{-2}+h_{11}z^{-3} \quad \text{(Eq. 16)}$$

However, in general, the multiplication reduction offered by filter response (anti-)symmetry, as in (Eq. 4) and (Eq. 5), is partially or completely lost with a polyphase realisation.

SUMMARY

The present invention aims to provide an integer factor sample rate conversion circuit, wherein the benefits of a symmetrical or asymmetrical impulse response on the one hand and those of a polyphase realisation on the other hand are combined.

The present invention relates to a circuit for converting the sample rate of a digital signal, comprising
 an input for applying the digital signal,
 a conversion filter having either a symmetrical or anti-symmetrical impulse response and implemented as a plurality of subfilters in parallel, each subfilter having a symmetrical or anti-symmetrical response derived from (a combination of) components of a polyphase decomposition of the impulse response,
 combining means deriving from said applied digital signal input signals of said plurality of subfilters or for combining output signals of said plurality of subfilters into a digital signal with converted rate,
 an output for outputting the digital signal with converted sample rate.

In a preferred embodiment the combining means are arranged for combining and interpolating output signals of the subfilters. The combining means further comprise means for adding and multiplying signals. The described circuit then acts as an L-factor interpolator.

In another preferred embodiment the combining means are arranged for decimating the input digital signal and for combining input signals to the subfilters. The combining means further comprise means for adding and multiplying signals. The circuit for sample rate conversion then advantageously further comprises adder means for summing output signals of the subfilters. The described circuit then acts as an L-factor decimator.

In another aspect the invention relates to an integrated circuit comprising a circuit for sample rate conversion as described.

SHORT DESCRIPTION OF THE DRAWINGS

DETAILED DESCRIPTION

Figure 1:
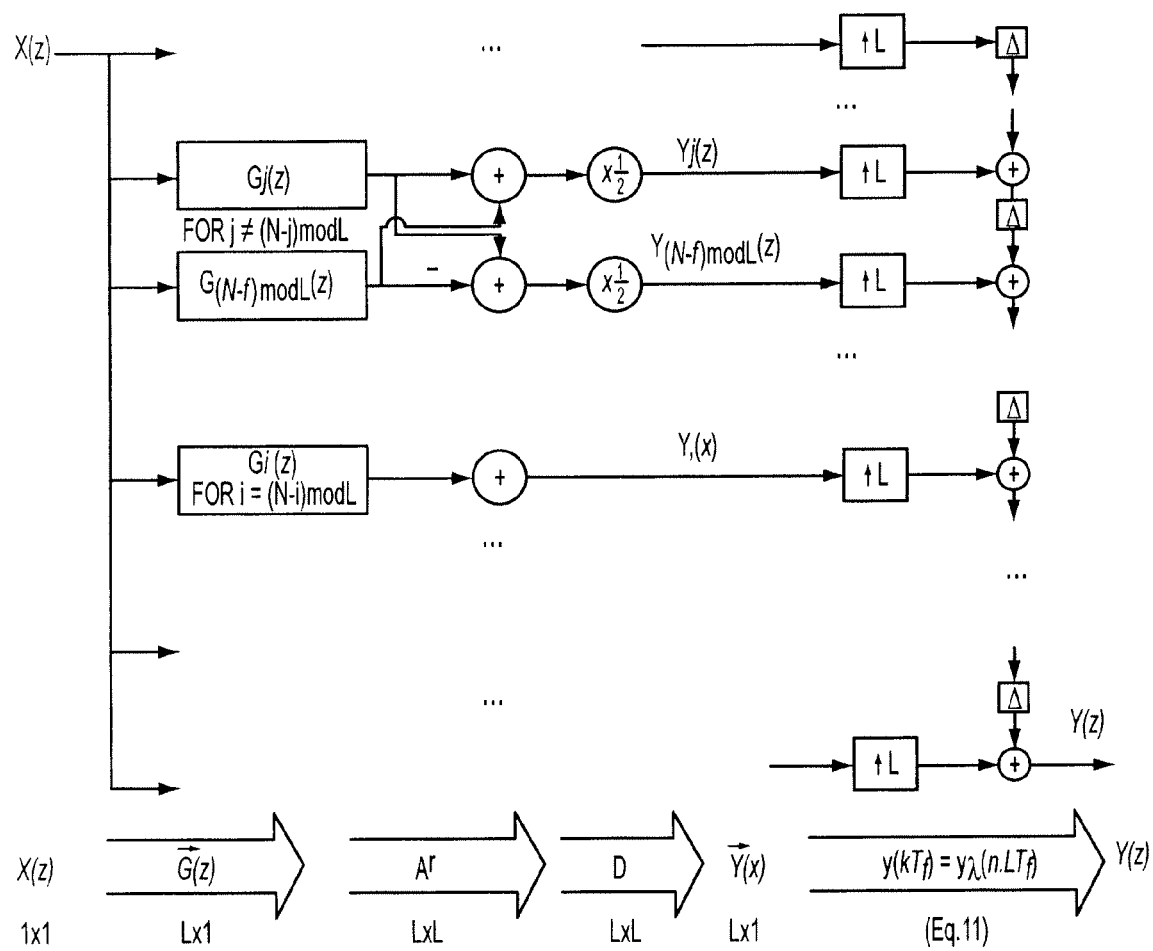
FIG. 1 represents an L-factor interpolator circuit according to the invention.

In the description of the invention below a Finite Impulse Response (FIR) with a symmetrical impulse response h(k) of length N+1 is assumed. Derivations for anti-symmetrical finite impulse response filters are similar and can readily be performed by a person skilled in the art. The filter is used as anti-imaging or anti-aliasing filter for L-factor interpolation or decimation, respectively.

The present invention aims at exploiting the h(k) symmetry and so to reduce the number of multiplications in a polyphase implementation, i.e. further than the factor L reduction in Equation 14.

The reduction is based on the fact that for each $H_\lambda(z)$ that is not symmetrical by itself ("intra" symmetrical), a polyphase component with the "flipped" response exists. Define two transfer functions of order P, A(z) and B(z), as complementary if equation 17 is true. A(z) then is a "flipped" version of B(z), and vice versa.

$$A(z)=z^{-P}B(z^{-1}) \quad \text{(Eq. 17)}$$

First it is shown that each polyphase component $H_\lambda(z)$ has a complement $H_\kappa(z)$, according to equation 17, with P and κ given in equations 18 and 19, respectively. Note that P is always an integer number.

$$P = \frac{N - \lambda - (N-\lambda) \bmod L}{L} \quad \text{(Eq. 18)}$$

$$\kappa = (N - \lambda) \bmod L \quad \text{(Eq. 19)}$$

Hence, it has to be proven that equation 20 is an identity.

$$H_\lambda(z)=z^{-P}H_\kappa(z^{-1}) \quad \text{(Eq. 20)}$$

Substituting (Eq. 19) yields (Eq. 21)

$$H_\lambda(z)=z^{-P}H_{(N-\lambda)\bmod L}(z^{-1}) \quad \text{(Eq. 21)}$$

Using the definition of Z-transform yields equation 22.

$$\sum_{i=-\infty}^{i=\infty} z^{-i}h_\lambda(i) = \sum_{j=-\infty}^{j=\infty} z^{-(P-j)}h_{(N-\lambda)\bmod L}(j) \quad \text{(Eq. 22)}$$

Substituting equation 8 yields equation 23.

$$\sum_{i=-\infty}^{i=\infty} z^{-i}h(\lambda+Li) = \sum_{j=-\infty}^{j=\infty} z^{-(P-j)}h((N-\lambda)\bmod L+Lj) \quad \text{(Eq. 23)}$$

Polynomes are equal if, for each power of z, corresponding coefficients are equal. So, substituting j with P−i yields equation 24.

$$h(\lambda+Li)=h((N-\lambda)\bmod L+L(P-i)) \quad \text{(Eq. 24)}$$

Using equation 2 yields equation 25.

$$h(\lambda+Li)=h(N-(N-\lambda)\bmod L-L(P-i)) \quad \text{(Eq. 25)}$$

Substituting Equation 18 yields equation 26.

$$h(\lambda + Li) = \quad \text{(Eq. 26)}$$
$$h\left(N-(N-\lambda)\bmod L-L\left(\frac{N-\lambda-(N-\lambda)\bmod L}{L}-i\right)\right)$$
$$h(\lambda + Li) = h(N-(N-\lambda)\bmod L-N+\lambda+(N-\lambda)\bmod L+Li)$$
$$h(\lambda + Li) = h(\lambda + Li) \quad (Q.E.D.)$$

It is to be noted that if $\lambda=(N-\lambda)\bmod L$, the complement of $H_\lambda(z)$ is $H_\lambda(z)$ itself, in which case $H_\lambda(z)$ is symmetrical. The fact that all polyphase components $H_\lambda(z)$ are complementary, either with $H_\lambda(z)$ itself or with another polyphase component, can be exploited to reduce the number of multiplications. This is elaborated next.

Define the L×L matrix $A=[\alpha_{i,j}]$, constructed row by row $\alpha_\lambda^T$ according to the following procedure (given in pseudocode):

---
```
for (λ = 0; λ L; ++λ)// start with row 0, end with row L-1
  κ = (N − λ)modL; //find complementary phase with Eq. 19
  if (κ == λ)              // symmetrical phase
    // type 1 row: all 0 except 1 on diagonal
```
$$a_\lambda^T = 0 \quad \text{(Eq. 27)}$$
$$a_{\lambda,\lambda} = 1;$$
```
  else if (κ > λ)           //2 phases with flipped response
    // row of type 2: all 0 except two 1's
```
$$a_\lambda^T = 0 \quad //(\text{Eq. 28})$$
$$a_{\lambda,\lambda} = a_{\lambda,\kappa} = 1;$$
```
  // row of type 3: all 0 except single 1 and −1
```
$$a_\kappa^T = 0; \quad //(\text{Eq. 29})$$
$$a_{\kappa,\lambda} = 1;$$
$$a_{\kappa,\kappa} = -1;$$
---

Matrix A has the following properties:
1. $A^T = A$ (A is symmetric)
2. A is invertible.
3. inner product $\langle \alpha_i^T, \alpha_j \rangle = 0$ if $i \neq j$ (the rows in A are orthogonal)
4. For the three types of rows $a_i^T$ defined above
   Type 1: $\langle a_i^T, a_i \rangle = 1$
   Type 2: $\langle a_i^T, a_i \rangle = 2$
   Type 3: $\langle a_i^T, a_i \rangle = 2$ Using properties 3 and 1, $A^TA$ is a diagonal matrix (Eq. 30).

$$A^TA = \begin{bmatrix} \langle a_0^T, a_0 \rangle & \ldots & \langle a_0^T, a_{L-1} \rangle \\ \ldots & \ldots & \ldots \\ \langle a_{L-1}^T, a_0 \rangle & \ldots & \langle a_{L-1}^T, a_{L-1} \rangle \end{bmatrix} \quad \text{(Eq. 30)}$$
$$= \begin{bmatrix} \langle a_0^T, a_0 \rangle & \ldots & 0 \\ \ldots & \ldots & \ldots \\ 0 & \ldots & \langle a_{L-1}^T, a_{L-1} \rangle \end{bmatrix}$$

Equation 31 defines an L×L matrix D:

$$D = \begin{bmatrix} \frac{1}{\langle a_0^T, a_0 \rangle} & \ldots & 0 \\ \ldots & \ldots & \ldots \\ 0 & \ldots & \frac{1}{\langle a_{L-1}^T, a_{L-1} \rangle} \end{bmatrix} \quad \text{(Eq. 31)}$$

Then equation 32 is true, with $I_{L \times L}$ the L×L identity matrix.

$$DA^TA = I_{L \times L} \quad \text{(Eq. 32)}$$

Substituting (Eq. 32) into (Eq. 10) yields equations 33 and 34.

$$\overline{G}(z) = A\overline{H}(z) \quad \text{(Eq. 33)}$$

$$\overline{Y}(z) = DA^T\overline{G}(z)X(z) \quad \text{(Eq. 34)}$$

Next it is pointed out why applying the expression of equation 34 is more efficient than that of Eq. 10 in terms of number of multiplications.

1. $\overline{G}(z)$ can be precomputed (offline), so Eq. 33 does not take any real-time computing resources, and hence only Eq. 34 is considered.
2. $A^T$ is very sparse and contains only 1 or −1 as non-zero values. Hence, multiplication with $A^T$ has no multiplication cost.
3. D is a diagonal matrix. Using property 4, the values $$\frac{1}{\langle a_i^T, a_i \rangle}$$

on its diagonal are either 1 or ½. Hence, multiplicating with D involves virtually no multiplication cost.

4. Three types of $G_i(z)$ as elements of $\overline{G}(z)$ exist, depending on the row type $a_i^T$ in $A^T$.

Type 1:
Since $(N-i)\bmod L = i$, $H_i(z)$ is its own complement, i.e. is symmetrical.
Using (Eq. 27) and (Eq. 33), $G_i(z) = H_i(z)$ and so $G_i(z)$ inherits the symmetry present in $H_i(z)$.

Type 2:
Using (Eq. 28)

$$G_\lambda(z) = H_\lambda(z) + H_\kappa(z)$$

Using (Eq. 19)

$$G_\lambda(z) = H_\lambda(z) + H_{(N-\lambda)\bmod L}(z)$$

Replace z by $z^{-1}$ and multiply both sides with $z^{-P}$ $$z^{31\,P}G_\lambda(z^{-1}) = z^{-P}H_\lambda(z^-) + z^{-P}H_{(N-\lambda)\bmod L}(z^{-1})$$

Using equation 21 (which is true because Eq. 20 is proven to be true):

$$z^{-P}G_A(z^{-1}) = H_{(N-\lambda) \bmod L}(z) + H_\lambda(z)$$

$$z^{-P}G_\lambda(z^{-1}) = G_\lambda(z)$$

Hence $G_\lambda(z)$ is symmetric.

Type 3:

Using (Eq. 29):

$$G_\lambda(z) = H_\lambda(z) - H_\kappa(z)$$

Using (Eq. 19)

$$G_\lambda(z) = H_\lambda(z) - H_{(N-\lambda) \bmod L}(z)$$

Replace z by $z^{-1}$ and multiply both sides with $z_{-P}$ $$z^{-P}G_\lambda(z^{-1}) = z^{-P}H_\lambda(z^{-1}) - z^{-P}H_{(N-\lambda) \bmod L}(z^{-1})$$

Using equation 21 (which is true because Eq. 20 is proven to be true):

$$z^{-P}G_\lambda(z^{-1}) = H_{(N-\lambda) \bmod L}(z) - H_\lambda(z)$$

$$z^{-P}G_\lambda(z^{-1}) = -G_\lambda(z)$$

Hence $G_\lambda(z)$ is anti-symmetric.

It has thus been shown that all elements $G_i(z)$ are either symmetrical or anti-symmetrical functions of order P, with P given in (Eq. 18). Substituting P for N into (Eq. 7) and summing over all i=0 ... L−1, averaged over L output samples yields the average number of multiplications per output sample #M (Eq. 35).

$$\# M = \frac{1}{L} \sum_{i=0}^{L-1} \left( \left\lfloor \frac{N - i - (N-i) \bmod L}{2 \cdot L} \right\rfloor + 1 \right) \quad \text{(Eq. 35)}$$

For N>>L, $$\# M \approx \left\lfloor \frac{N}{2 \cdot L} \right\rfloor + 1,$$

which is approximately a factor of two improvement versus (Eq. 14).

The original polyphase filtering operation $\overline{H}(z)$ in Eq. 10 is replaced by a sequence of 3 operations (Eq. 34) applied in the order $\overline{G}(z), A^T, D$.

FIG. 1 shows the corresponding schematic for an L-factor interpolator realisation. As represented by the arrows at the bottom in FIG. 1, the signal flows from left to right, starting with a scalar input signal X(z) and transformed consecutively by $\overline{G}(z), A^T$ and D, into the polyphase vector $\overline{Y}(z)$.

First, X(z) is multiplied with $\overline{G}(z)$, a vector with only symmetrical and anti-symmetrical transfer functions as elements. This fact can be exploited for multiplication reduction, as explained before.

Then, the signal is multiplied with $A^T$, a sparse vector with only 1 and −1 as non-zero values.

Then, the signal is multiplied with D, a diagonal matrix with either 1 or ½ on the diagonal.

Finally, the vector signal $\overline{Y}(z)$ is combined into the (interpolated) higher-rate, scalar output signal Y(z). This combination is the inverse operation of polyphase decomposition (Eq. 11). Note that this final stage has the behaviour of a parallel-to-serial conversion, or also of a fast commuting switch, picking in turn a value for Y(z) from each of the $Y_\lambda(z)$ element.

Depending on the actual value of (L,N), matrix $A^T$ consists of a number of Type 1 rows (Eq. 27) and a number of Type 2 (Eq. 28) and Type 3 (Eq. 29) row pairs, as explained before. The example in FIG. 1 shows one $d_i a_i^T \overline{g}_i(z)$ row for $\alpha_i^T$ of Type 1, i.e. i=(N−i)modL, and one row pair for j≠(N−j)modL, i.e. with rows $\alpha_i^T$ and $\alpha_{(N-j) \bmod L}^T$ of Types 2 and 3, respectively.

Equation 36 is the L-phase decimator equivalent for (Eq. 34).

$$Y(z) = \overline{G}^T(z) A D^T \overline{X}(z) \quad \text{(Eq. 36)}$$

Figure 2:
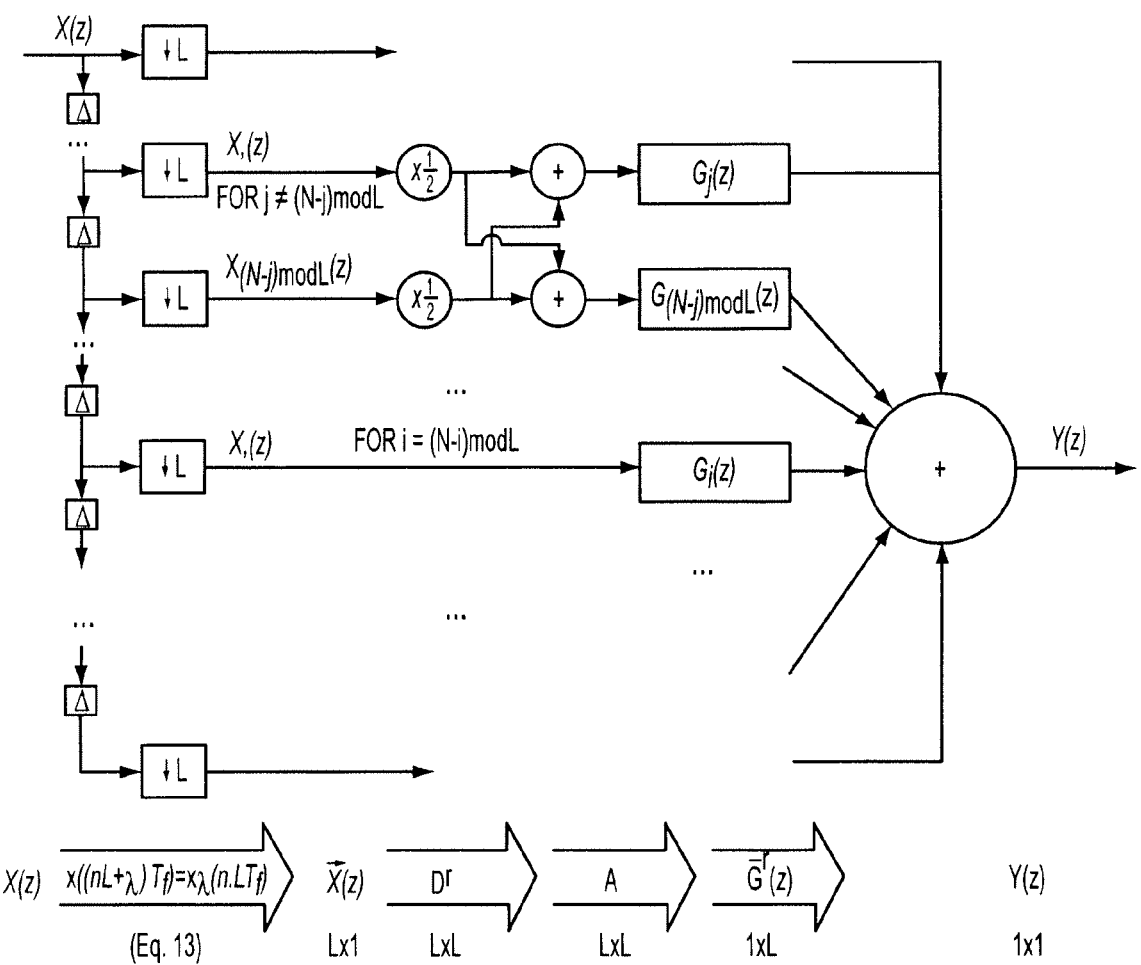
FIG. 2 represents an L-factor decimator circuit according to the invention.

The same expression for #M as given in equation 35 applies. FIG. 2 shows the corresponding schematic for an L-factor decimator realisation. As represented by the arrows at the bottom in FIG. 2, the signal flows from left to right. First, according to Eq. 13, a serial-to-parallel converter performs a polyphase decomposition from the scalar input signal X(z) into the output vector X(z).

Then, the vector $\overline{X}(z)$ is multiplied with diagonal matrix $D^T$, with either 1 or ½ on the diagonal.

Next, the signal is multiplied with A, a sparse matrix with only 1 and −1 as non-zero values.

Finally, a dot product with $\overline{G}^T(z)$ results in the scalar low rate (decimated) output signal Y(z). All elements of vector $\overline{G}^T(z)$ are either symmetrical or anti-symmetrical transfer functions. This can be exploited to reduce the number of multiplications, as explained before.

Depending on the actual value of (L,N), matrix A consists of a number of Type 1 rows (Eq. 27) and a number of Type 2 (Eq. 28) and Type 3 (Eq. 29) row pairs.

The example in FIG. 2 shows one row for $a_i^T$ of Type 1, i.e. i=N−i)modL, and one row pair for j≠(N−j)modL, i.e. with rows $a_i^T$ and $\alpha_{(N-j) \bmod L}^T$ of Types 2 and 3, respectively.

What is claimed is:

1. Circuit for converting the sample rate of a digital signal, the circuit comprising an integer factor sample rate conversion circuit, wherein the benefits of a symmetrical or asymmetrical impulse response on the one hand and those of a polyphase realization on the other hand are combined, the circuit further comprising an input for applying said digital signal, a conversion filter having either a symmetrical or anti-symmetrical impulse response and a polyphase realization, the conversion filter implemented as a plurality of subfilters in parallel, each subfilter having a symmetrical or anti-symmetrical response derived from a combination of the conversion filter polyphase components, the combination including multiplying the digital signal only with factors of 1 and −1, combining means for combining said applied digital signal input signals of said plurality of subfilters or for combining output signals of said plurality of subfilters into a digital signal with converted sample rate, after multiplying the applied digital signal input signals of said plurality of subfilters or after multiplying the output signals of said plurality of subfilters, with factors 1 or ½, an output for outputting said digital signal with converted sample rate.

2. A circuit for converting the sample rate of a digital signal, comprising:

an input for applying said digital signal, a conversion filter having either a symmetrical or anti-symmetrical impulse response and implemented as a plurality of subfilters in parallel, each subfilter having a symmetrical or anti-symmetrical response derived from components of a polyphase decomposition of said impulse response, combining means for deriving from said applied digital signal input signals of said plurality of subfilters or for combining output signals of said plurality of subfilters into a digital signal with converted sample rate, and an output for outputting said digital signal with converted sample rate, wherein said combining means are arranged for combining and interpolating output signals of said subfilters, said combining means further comprising means for adding and multiplying signals.

3. Circuit for sample rate conversion as in claim 2, whereby said combining means are arranged for decimating said input digital signal and for combining input signals to said subfilters, and combining means further comprising means for adding and multiplying signals.

4. Circuit for sample rate conversion as in claim 3, further comprising adder means for summing output signals of said subfilters.

5. An integrated circuit comprising a circuit for sample rate conversion as in claim 2.

* * * * *